United States Patent [19]
Hasegawa

[11] Patent Number: 6,091,109
[45] Date of Patent: Jul. 18, 2000

[54] SEMICONDUCTOR DEVICE HAVING DIFFERENT GATE OXIDE THICKNESSES BY IMPLANTING HALOGENS IN ONE REGION AND NITROGEN IN THE SECOND REGION

[75] Inventor: Eiji Hasegawa, Tokyo, Japan

[73] Assignee: NEC Corporation, Tokyo, Japan

[21] Appl. No.: 09/309,866

[22] Filed: May 11, 1999

[30] Foreign Application Priority Data

May 11, 1998 [JP] Japan .................................. 10-127256

[51] Int. Cl.⁷ .................................................... H01L 29/76

[52] U.S. Cl. .......................... 257/339; 438/275; 438/981

[58] Field of Search ............................ 257/339; 438/258, 438/275

[56] References Cited

U.S. PATENT DOCUMENTS 5,254,489  10/1993  Nakata ..................................... 438/258
5,480,828   1/1996  Hsu et al. ............................... 438/275

*Primary Examiner*—Charles Bowers
*Assistant Examiner*—William M. Brewster
*Attorney, Agent, or Firm*—Scully, Scott, Murphy & Presser

[57] ABSTRACT

The present invention provides a structure comprising: a first oxide film having a first thickness and extending on a first region of a semiconductor substrate; and a second oxide film having a second thickness which is thicker than the first thickness of the first oxide film, the second oxide film extending on a second region of the semiconductor substrate, wherein the first oxide film contains a first substance which is capable of decreasing an oxidation rate of a thermal oxidation process, while the second oxide film contains a second substance which is capable of increasing the oxidation rate of the thermal oxidation process.

10 Claims, 12 Drawing Sheets

SEMICONDUCTOR DEVICE HAVING DIFFERENT GATE OXIDE THICKNESSES BY IMPLANTING HALOGENS IN ONE REGION AND NITROGEN IN THE SECOND REGION

BACKGROUND OF THE INVENTION

The present invention relates to a semiconductor device, and more particularly to a semiconductor device having thickness different gate oxide films and a method of forming the same.

One of the most important issues for development of the semiconductor devices is how to improve the reliability of the gate oxide films and also realize a high controllability in thickness of the gate oxide films. The thickness of the gate oxide film of the field effect transistor is different between in the logic device and the peripheral device. The most important issue is how to realize a high controllability information of the gate oxide films different in thickness over a single semiconductor substrate.

It has been known in the art to which the invention pertains that two gate oxide films having different thicknesses are formed by two different oxidation processes. FIGS. 1A through 1C are fragmentary cross sectional elevation views illustrative of the conventional method of forming the two gate oxide films having different thicknesses of the two field effect transistors on a single semiconductor substrate.

With reference to FIG. 1A, Field oxide films 11 are selectively formed on a surface of a silicon substrate 10 to define two device regions "A" and "B" as active regions of the silicon substrate 10. Gate oxide films 19 are formed on the two device regions as active regions of the silicon substrate 10.

With reference to FIG. 1B, a photo-resist film 20 is selectively formed on the device region "B" of the silicon substrate 10. The gate oxide film 19 but only on the device region "A" is subjected to a wet etching by use of a hydrofluoric acid based etchant to remove the gate oxide film 19 from the device region "A".

With reference to FIG. 1C, the photo-resist film 20 is then removed and a cleaning process is carried out before a heat treatment is carried out to cause a second oxidation, whereby a thin gate oxide film 23 is formed on the device region "A" of the silicon substrate 10 whilst the gate oxide film 19 on the device region "B" is made thicker to form a thick gate oxide film 22 on the device region "B". As a result, the thickness different two oxide films are formed on the two device regions.

The above conventional method is, however, engaged with the following problems. The above conventional method needs the process for applying a photo-resist on the gate oxide film 19 on the device region "B" for subsequent wet etching process to remove the other gate oxide film 19 on the device region "A". The photo-resist contains various contaminants such as irons and organic substances. After the photo-resist is applied on the gate oxide film 19 on the device region "B", then the various contaminants such as irons and organic substances may be introduced into the gate oxide film 19 on the device region "B", whereby the insulating property or reliability of the gate oxide film 19 on the device region "B" is deteriorated.

Further, after the photo-resist has been removed from the device region "B", then the cleaning process is carried out by use of a small amount of the etchant which causes a slight etching to the surface region of the gate oxide film 19 on the device region "B", whereby the thickness of the gate oxide film 19 on the device region "B" is slightly reduced. It is difficult to control the reduction in thickness of the gate oxide film 19 on the device region "B", for which reason it is difficult to control the reduction in thickness of the thick gate oxide film 22 on the device region "B".

Furthermore, the thermal oxidation process for forming the oxide film allows a diffusion of oxidation seeds in the film to provide a large influence to an oxidation rate, for which reason it is difficult to realize a high controllability in thickness of the oxide film. This thermal oxidation process is largely different from the deposition process such as a chemical vapor deposition for forming the oxide film Another method of forming the thickness different two gate oxide films over a single semiconductor substrate has been known, wherein an ion-implantation is utilized. Nitrogen atoms have been introduced into a silicon substrate before oxidation is made to the surface of the silicon substrate, whereby the oxidation rate is largely suppressed by the implanted nitrogen atoms. For example, the nitrogen atoms have been selectively implanted into the device region "A" only, before the thermal oxidation is made to both surfaces of the nitrogen introduced device regions "A" and the nitrogen free device region "B", whereby the oxidation rate on the nitrogen introduced device regions "A" is slower than the oxidation rate on the nitrogen free device region "B" in order to differentiate the thicknesses of the two gate oxide films on the nitrogen introduced device regions "A" and the nitrogen free device region "B". This second conventional method needs a single oxidation process and a single ion-implantation process.

FIG. 2 is a diagram illustrative of variations in thickness of a gate oxide film over oxidation time under various conditions of dose of nitrogen ions into a silicon substrate, thereby illustrating a relationship of a growth rate of the gate oxide film to the nitrogen ion dose. If no nitrogen ion is introduced into the silicon substrate, then a thermal oxidation for 30 minutes results in a formation of an oxide film having a thickness of 8 nanometers. If nitrogen ions are introduced into the silicon substrate at a dose of 5E13, then a thermal oxidation for 30 minutes results in a formation of an oxide film having a thickness of 6.8 nanometers. If nitrogen ions are introduced into the silicon substrate at a dose of 1E14, then a thermal oxidation for 30 minutes results in a formation of an oxide film having a thickness of 5.2 nanometers. If nitrogen ions are introduced into the silicon substrate at a dose of 5E14, then a thermal oxidation for 30 minutes results in a formation of an oxide film having a thickness of 3.6 nanometers. If nitrogen ions are introduced into the silicon substrate at a dose of 1E15, then a thermal oxidation for 30 minutes results in a formation of an oxide film having a thickness of 2.8 nanometers. The increase in dose of the nitrogen atoms into the silicon substrate reduces the oxidation rate of the oxide film.

FIG. 3 is a diagram illustrative of variations in flat-band voltage of a field effect transistor having a gate oxide film formed on an nitrogen containing surface of a silicon substrate under various conditions of dose of nitrogen ions into the silicon substrate. Increase of ion-implanted nitrogen atoms causes the increase of the fixed charges and also drop in electron mobility of the transistors. If the nitrogen ions are introduced into the silicon substrate at a dose of not less than $7E14$ atoms/cm$^2$, the performance of the transistor having a thinner gate oxide film is dropped below the acceptable performance range. Namely, it is unavailable to carry out the ion-implantation of nitrogen at a high dose of not less than $7E14$ atoms/cm$^2$.

An alternate available method for controlling the thickness of the gate oxide film or suppressing the oxidation rate of the gate oxide film is to carry out an ion-implantation of halogen atoms into the silicon substrate in place of the nitrogen atoms. FIG. 4 is a diagram illustrative of variations in thickness of a gate oxide film over oxidation time under various conditions of dose of halogen atoms into a silicon substrate, thereby illustrating a relationship of a growth rate of the gate oxide film to the halogen atom dose. If no halogen atom is introduced into the silicon substrate, then a thermal oxidation for 30 minutes results in a formation of an oxide film having a thickness of 8 nanometers. If halogen atoms are introduced into the silicon substrate at a dose of 5E13, then a thermal oxidation for 30 minutes results in a formation of an oxide film having a thickness of 9 nanometers. If halogen atoms are introduced into the silicon substrate at a dose of 2E14, then a thermal oxidation for 30 minutes results in a formation of an oxide film having a thickness of 11 nanometers. If halogen atoms are introduced into the silicon substrate at a dose of 7E14, then a thermal oxidation for 30 minutes results in a formation of an oxide film having a thickness of 13 nanometers. The increase in dose of the halogen atoms into the silicon substrate increases the oxidation rate of the oxide film. This method doping the halogen atoms into the silicon substrate is also engaged with the following problems.

FIG. 5 is a diagram illustrative of variations in density of the interface state of the gate oxide film formed on a fluorine introduced silicon substrate surface by a thermal oxidation in a moisture atmosphere. The density of the interface state becomes minimum at the dose of fluorine atoms of about $1E14$ atoms/cm$^2$. However, the increase in the dose of fluorine atoms from about $1E14$ atoms/cm$^2$ also increases the density of the interface state, whereby the performances of the transistor are deteriorated. The dose of fluorine atoms of about $1E14$ atoms/cm$^2$ relaxes the strain of the interface between silicon and silicon oxide. However, the higher dose than about $1E14$ atoms/cm$^2$ results in no relaxation in the strain of the interface between silicon and silicon oxide. In order to realize a large difference in thickness of the gate oxide films, for example, 3 nanometers, it is necessary to introduce fluorine atoms at a dose of not less than $5E14$ atoms/cm$^2$. The introduction of fluorine atoms at a dose of not less than $5E14$ atoms/cm$^2$ results in a higher density of the interface state than the acceptable density range.

In the above circumstances, it had been required to develop a novel structure of two thickness different gate oxide films over a single silicon substrate free from the above problems and a method of forming the same.

SUMMARY OF THE INVENTION

Accordingly, it is an object of the present invention to provide a novel structure of two thickness different gate oxide films over a single silicon substrate free from the above problems.

It is a further object of the present invention to provide a novel method of forming two thickness different gate oxide films over a single silicon substrate free from the above problems.

The present invention provides a structure comprising: a first oxide film having a first thickness and extending on a first region of a semiconductor substrate; and a second oxide film having a second thickness which is thicker than the first thickness of the first oxide film, the second oxide film extending on a second region of the semiconductor substrate, wherein the first oxide film contains a first substance which is capable of decreasing an oxidation rate of a thermal oxidation process, whilst the second oxide film contains a second substance which is capable of increasing the oxidation rate of the thermal oxidation process.

The other present invention provides a gate oxide structure comprising: a semiconductor substrate having at least first and second surface regions isolated by a field oxide film; a first gate oxide film having a first thickness and extending on the first surface region of the semiconductor substrate; and a second gate oxide film having a second thickness which is thicker than the first thickness of the first gate oxide film, the second gate oxide film extending on the second region of the semiconductor substrate, wherein the first gate oxide film contains a first substance which is capable of decreasing an oxidation rate of a thermal oxidation, whilst the second gate oxide film contains a second substance which is capable of increasing the oxidation rate of the thermal oxidation process.

The still other present invention provides a method of forming a structure comprising the steps of: forming thin oxide films on first and second regions of a semiconductor substrate; selectively introducing a first substance into the first oxide film on the first region and a second substance into the second oxide film on the second region respectively, wherein the first substance is capable of decreasing an oxidation rate of a thermal oxidation process whilst the second substance is capable of increasing an oxidation rate of a thermal oxidation process; and carrying out a thermal oxidation of the semiconductor substrate so as to form a first oxide film on the first region at a first oxidation rate and a second oxide film on the second region at a second oxidation rate higher than the first oxidation rate, whereby the first oxide film has a first thickness and the second oxide film has a second thickness which is thicker than the first thickness of the first oxide film.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
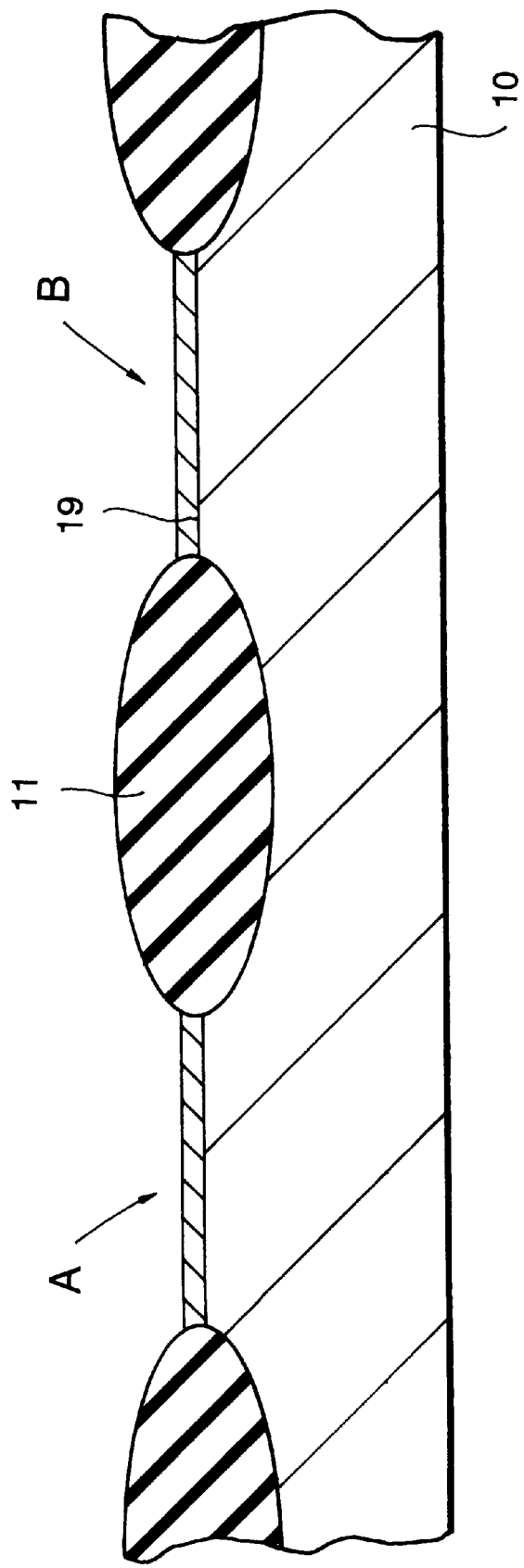
FIGS. 1A through 1C are fragmentary cross sectional elevation views illustrative of the conventional method of forming the two gate oxide films having different thicknesses of the two field effect transistors on a single semiconductor substrate.
Figure 1B:
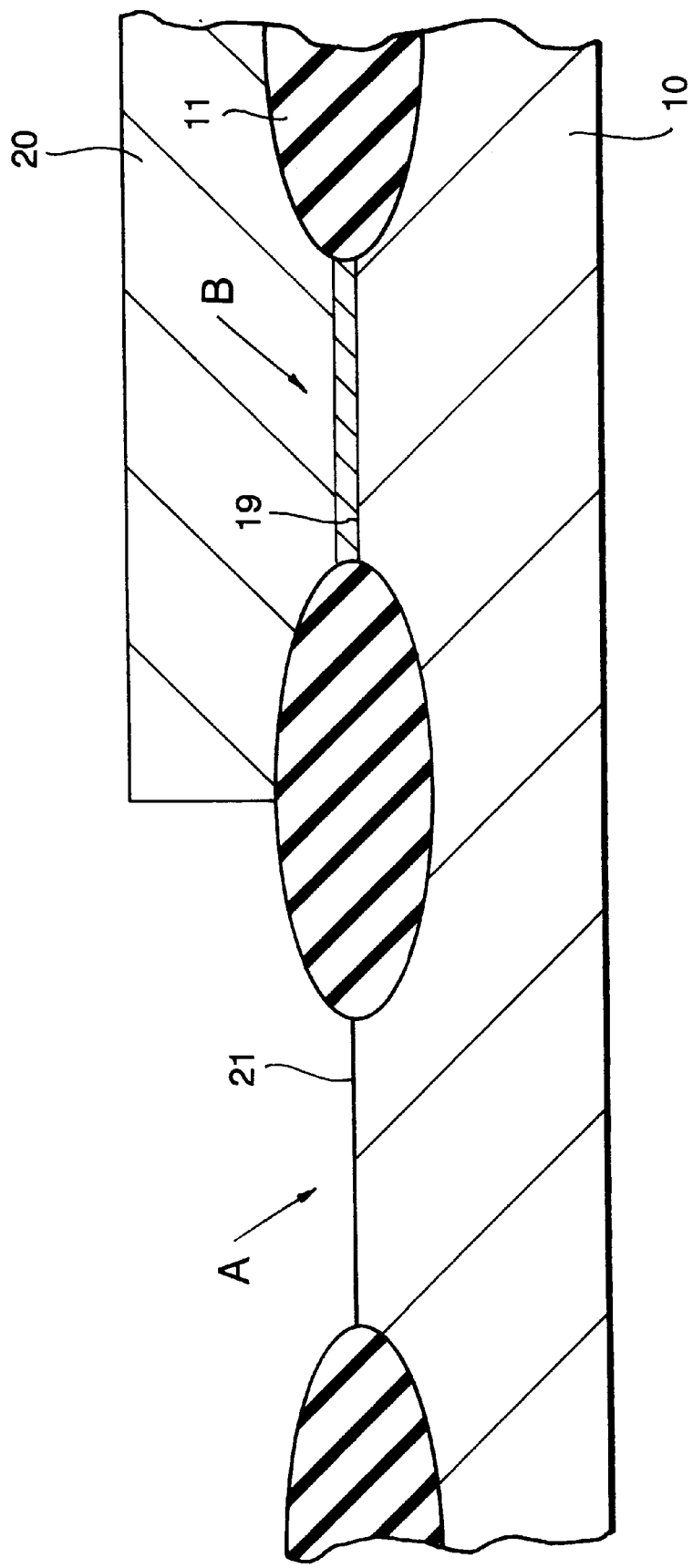
Figure 1C:
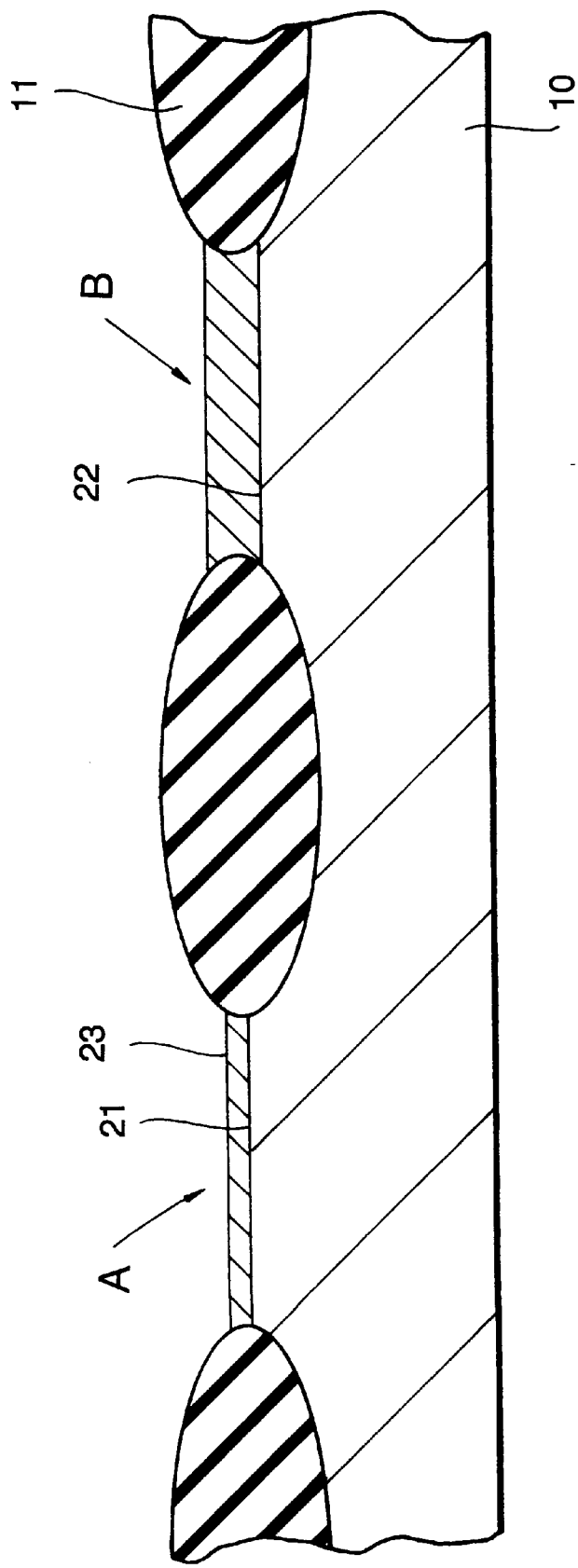

The present invention provides a structure comprising: a first oxide film having a first thickness and extending on a first region of a semiconductor substrate; and a second oxide film having a second thickness which is thicker than the first thickness of the first oxide film, the second oxide film extending on a second region of the semiconductor substrate, wherein the first oxide film contains a first substance which is capable of decreasing an oxidation rate of a thermal oxidation process, whilst the second oxide film contains a second substance which is capable of increasing the oxidation rate of the thermal oxidation process.

It is preferable that the first substance includes nitrogen.

It is also preferable that the second substance includes halogen. It is further preferable that the second substance includes fluorine.

The above present invention may be applied to various semiconductor devices.

In accordance with the above present invention, it is possible to form at least two oxide films different in thickness from each other by a single thermal oxidation process. If those oxide films are applied to gate oxide films for field effect transistors, then it is possible to realize the field effect transistors showing different properties and characteristics. The thinner gate oxide film is free from deterioration in reliability of this gate oxide film and also free from variations in threshold voltage due to a phenomenon of punch through of boron from the gate electrode in a p-channel MOS field effect transistor. The thicker gate oxide film is free from formations of many interface states on an interface between silicon and silicon oxide as well as free from radiation damage.

Namely, the thinner oxide film contains a first substance which is capable of decreasing an oxidation rate of a thermal oxidation process, whilst the thicker oxide film contains a second substance which is capable of increasing the oxidation rate of the thermal oxidation process, thereby allowing formations of the oxide films different in thickness by at least 3 nanometers from each other through a single thermal oxidation process without, however, any deteriorations of reliability and insulating properties. Both ion-implantations of the first and second substances to the thinner and thicker oxide films are essential for avoiding the problems caused by an excessively high dose of only one of the first and second substances. It is, therefore, possible to avoid the problems caused by the excessively high dose of the first substance, wherein the problems are concerned with the increase of the fixed charges and also drop in electron mobility of the transistors, deteriorating the high speed performances of the transistor as well as the deterioration in life-time of the oxide films. It is, further, possible to avoid the other problems caused by the excessively high dose of the second substance, wherein the problems are concerned with the increase in amount of the interface state, which deteriorates the reliability of the oxide films. Furthermore, as the requirement for scaling down the transistors has been on the increase, the requirement for reduction in thickness of the oxide films or gate oxide films has also bee on the increase. For the logic devices, the thickness of the gate oxide film is required to be not thicker than 3 nanometers. Under those requirement, it is difficult for the conventional or normal thermal oxidation process to form the oxide films having highly accurate or controlled thicknesses. In order to obtain a sufficient difference in thickness of the oxide films with keeping the required or desired characteristics and properties, it is required or essential that the thinner oxide film contains a first substance which is capable of decreasing an oxidation rate of a thermal oxidation process, whilst the thicker oxide film contains a second substance which is capable of increasing the oxidation rate of the thermal oxidation process.

The other present invention provides a gate oxide structure comprising: a semiconductor substrate having at least first and second surface regions isolated by a field oxide film; a first gate oxide film having a first thickness and extending on the first surface region of the semiconductor substrate; and a second gate oxide film having a second thickness which is thicker than the first thickness of the first gate oxide film, the second gate oxide film extending on the second region of the semiconductor substrate, wherein the first gate oxide film contains a first substance which is capable of decreasing an oxidation rate of a thermal oxidation, whilst the second gate oxide film contains a second substance which is capable of increasing the oxidation rate of the thermal oxidation process.

It is preferable that the first substance includes nitrogen.

It is preferable that the second substance includes halogen.

It is further preferable that the second substance includes fluorine.

The above other present invention may also be applicable to various semiconductor devices.

In accordance with the above other present invention, it is possible to form at least two oxide films different in thickness from each other by a single thermal oxidation process. If those oxide films are applied to gate oxide films for field effect transistors, then it is possible to realize the field effect transistors showing different properties and characteristics. The thinner gate oxide film is free from deterioration in reliability of this gate oxide film and also free from variations in threshold voltage due to a phenomenon of punch through of boron from the gate electrode in a p-channel MOS field effect transistor. The thicker gate oxide film is free from formations of many interface states on an interface between silicon and silicon oxide as well as free from radiation damage.

Namely, the thinner oxide film contains a first substance which is capable of decreasing an oxidation rate of a thermal oxidation process, whilst the thicker oxide film contains a second substance which is capable of increasing the oxidation rate of the thermal oxidation process, thereby allowing formations of the oxide films different in thickness by at least 3 nanometers from each other through a single thermal oxidation process without, however, any deteriorations of reliability and insulating properties. Both ion-implantations of the first and second substances to the thinner and thicker oxide films are essential for avoiding the problems caused by an excessively high dose of only one of the first and second substances. It is, therefore, possible to avoid the problems caused by the excessively high dose of the first substance, wherein the problems are concerned with the increase of the fixed charges and also drop in electron mobility of the transistors, deteriorating the high speed performances of the transistor as well as the deterioration in life-time of the oxide films. It is, further, possible to avoid the other problems caused by the excessively high dose of the second substance, wherein the problems are concerned with the increase in amount of the interface state, which deteriorates the reliability of the oxide films. Furthermore, as the requirement for scaling down the transistors has been on the increase, the requirement for reduction in thickness of the oxide films or gate oxide films has also bee on the increase. For the logic devices, the thickness of the gate oxide film is required to be not thicker than 3 nanometers. Under those requirement, it is difficult for the conventional or normal thermal oxidation process to form the oxide films having highly accurate or controlled thicknesses. In order to obtain a sufficient difference in thickness of the oxide films with keeping the required or desired characteristics and properties, it is required or essential that the thinner oxide film contains a first substance which is capable of decreasing an oxidation rate of a thermal oxidation process, whilst the thicker oxide film contains a second substance which is capable of increasing the oxidation rate of the thermal oxidation process.

The still other present invention provides a method of forming a structure comprising the steps of: forming thin oxide films on first and second regions of a semiconductor substrate; selectively introducing a first substance into the first oxide film on the first region and a second substance into the second oxide film on the second region respectively, wherein the first substance is capable of decreasing an oxidation rate of a thermal oxidation process whilst the second substance is capable of increasing an oxidation rate of a thermal oxidation process; and carrying out a thermal oxidation of the semiconductor substrate so as to form a first oxide film on the first region at a first oxidation rate and a second oxide film on the second region at a second oxidation rate higher than the first oxidation rate, whereby the first oxide film has a first thickness and the second oxide film has a second thickness which is thicker than the first thickness of the first oxide film.

It is preferable that the first substance includes nitrogen.

It is also preferable that the second substance includes halogen. It is further preferable that the second substance includes fluorine.

In accordance with the above other present invention, it is possible to form at least two oxide films different in thickness from each other by a single thermal oxidation process. If those oxide films are applied to gate oxide films for field effect transistors, then it is possible to realize the field effect transistors showing different properties and characteristics. The thinner gate oxide film is free from deterioration in reliability of this gate oxide film and also free from variations in threshold voltage due to a phenomenon of punch through of boron from the gate electrode in a p-channel MOS field effect transistor. The thicker gate oxide film is free from formations of many interface states on an interface between silicon and silicon oxide as well as free from radiation damage.

Namely, processes are carried out for selectively introducing a first substance into the thin oxide film on the first region and a second substance into the thin oxide film on the second region respectively, wherein the first substance is capable of decreasing an oxidation rate of a thermal oxidation process whilst the second substance is capable of increasing an oxidation rate of a thermal oxidation process, and subsequently carrying out a thermal oxidation of the semiconductor substrate so as to form a first oxide film on the first region at a first oxidation rate and a second oxide film on the second region at a second oxidation rate higher than the first oxidation rate, whereby the first oxide film has a first thickness and the second oxide film has a second thickness which is thicker than the first thickness of the first oxide film, thereby allowing formations of the oxide films different in thickness by at least 3 nanometers from each other through a single thermal oxidation process without, however, any deteriorations of reliability and insulating properties. Both ion-implantations of the first and second substances to the thinner and thicker oxide films are essential for avoiding the problems caused by an excessively high dose of only one of the first and second substances. It is, therefore, possible to avoid the problems caused by the excessively high dose of the first substance, wherein the problems are concerned with the increase of the fixed charges and also drop in electron mobility of the transistors, deteriorating the high speed performances of the transistor as well as the deterioration in life-time of the oxide films. It is, further, possible to avoid the other problems caused by the excessively high dose of the second substance, wherein the problems are concerned with the increase in amount of the interface state, which deteriorates the reliability of the oxide films. Furthermore, as the requirement for scaling down the transistors has been on the increase, the requirement for reduction in thickness of the oxide films or gate oxide films has also bee on the increase. For the logic devices, the thickness of the gate oxide film is required to be not thicker than 3 nanometers. Under those requirement, it is difficult for the conventional or normal thermal oxidation process to form the oxide films having highly accurate or controlled thicknesses. In order to obtain a sufficient difference in thickness of the oxide films with keeping the required or desired characteristics and properties, it is required or essential to selectively introduce a first substance into the thin oxide film on the first region and a second substance into the thin oxide film on the second region respectively, wherein the first substance is capable of decreasing an oxidation rate of a thermal oxidation process whilst the second substance is capable of increasing an oxidation rate of a thermal oxidation process, and subsequently carry out a thermal oxidation of the semiconductor substrate so as to form a first oxide film on the first region at a first oxidation rate and a second oxide film on the second region at a second oxidation rate higher than the first oxidation rate, whereby the first oxide film has a first thickness and the second oxide film has a second thickness which is thicker than the first thickness of the first oxide film.

Figure 6:
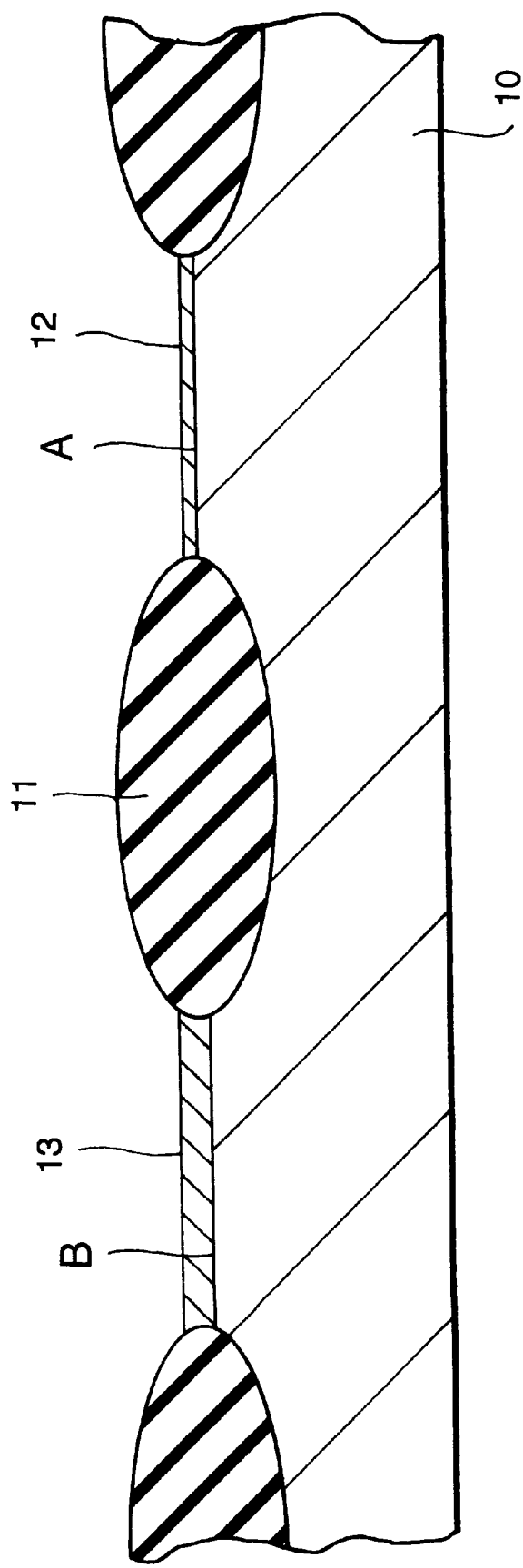
FIG. 6 is a fragmentary cross sectional elevation view illustrative of a novel structure of two gate oxide films differing in thickness from each other and as formed on a single semiconductor substrate in accordance with the present invention.

A first embodiment according to the present invention will be described in detail with reference to the drawings. FIG. 6 is a fragmentary cross sectional elevation view illustrative of a novel structure of two gate oxide films differing in thickness from each other and as formed on a single semiconductor substrate in accordance with the present invention. Field oxide films 11 are selectively formed on a silicon substrate 10 to define first and second device regions "A" and "B". The field oxide films 11 have a thickness of, for example, 400 nanometers. A first gate oxide film 12 is provided on the first device region "A", whilst a second gate oxide film 13 is provided on the second device region "B". The first gate oxide film 12 has a first thickness whilst the second gate oxide film 13 has a second thickness which is thicker than the first thickness. The first gate oxide film 12 contains a first substance which is capable of decreasing an oxidation rate of a thermal oxidation process. The second gate oxide film 13 contains a second substance which is capable of increasing said oxidation rate of said thermal oxidation process. The first gate oxide film 12 may comprise a nitrogen containing oxide film having a thickness of 3 nanometers. The second gate oxide film 13 may comprise a fluorine containing oxide film having a thickness of 8 nanometers. Those first and second gate oxide films may be formed on adjacent two device regions or far two device regions from each other provided those regions are over the single substrate.

FIGS. 7A through 7D are fragmentary cross sectional elevation views illustrative of semiconductor substrates on which first and second gate oxide films differing in thickness are formed in sequential steps involved in a novel fabrication process.

Figure 7A:
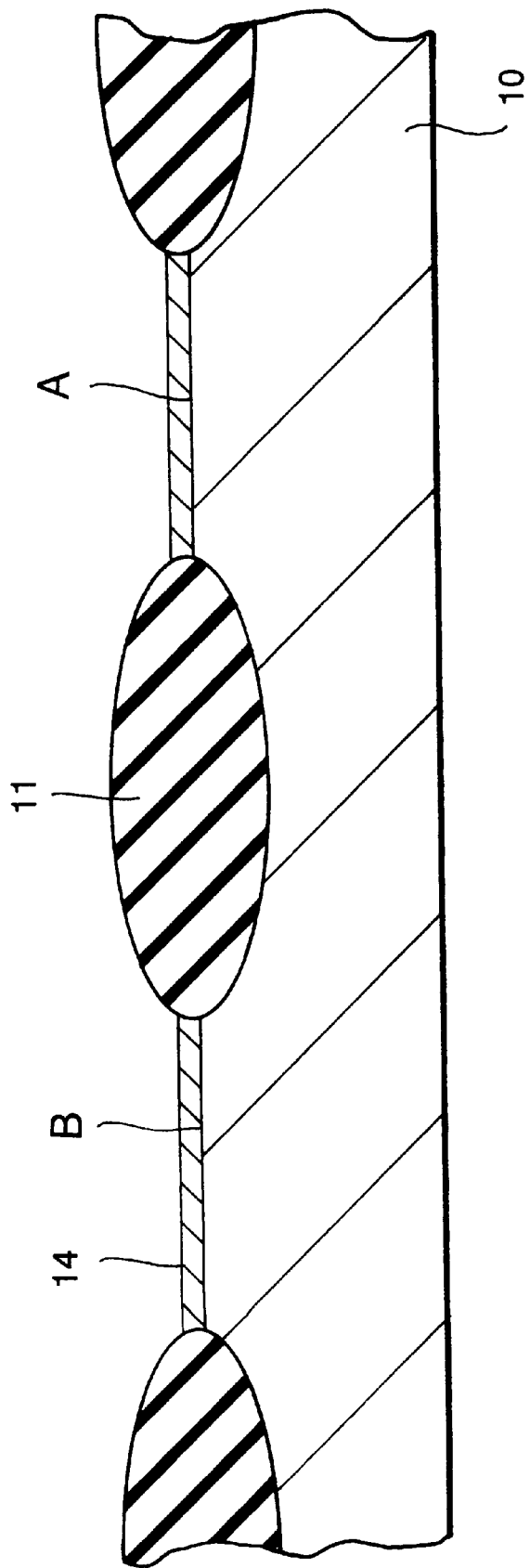
FIGS. 7A through 7D are fragmentary cross sectional elevation views illustrative of semiconductor substrates on which first and second gate oxide films differing in thickness are formed in sequential steps involved in a novel fabrication process in accordance with the present invention.

With reference to FIG. 7A, field oxide films 11 having a thickness of 400 nanometers are selectively formed over a surface of a silicon substrate 10 to define first and second active regions "A" and "B" by a local oxidation of silicon method. A silicon oxide film 14 having a thickness of 16 nanometers is formed on both the first and second active regions "A" and "B" by a heat treatment in a steam atmosphere prepared by a pyrojenic method at a temperature of 850° C.

Figure 7B:
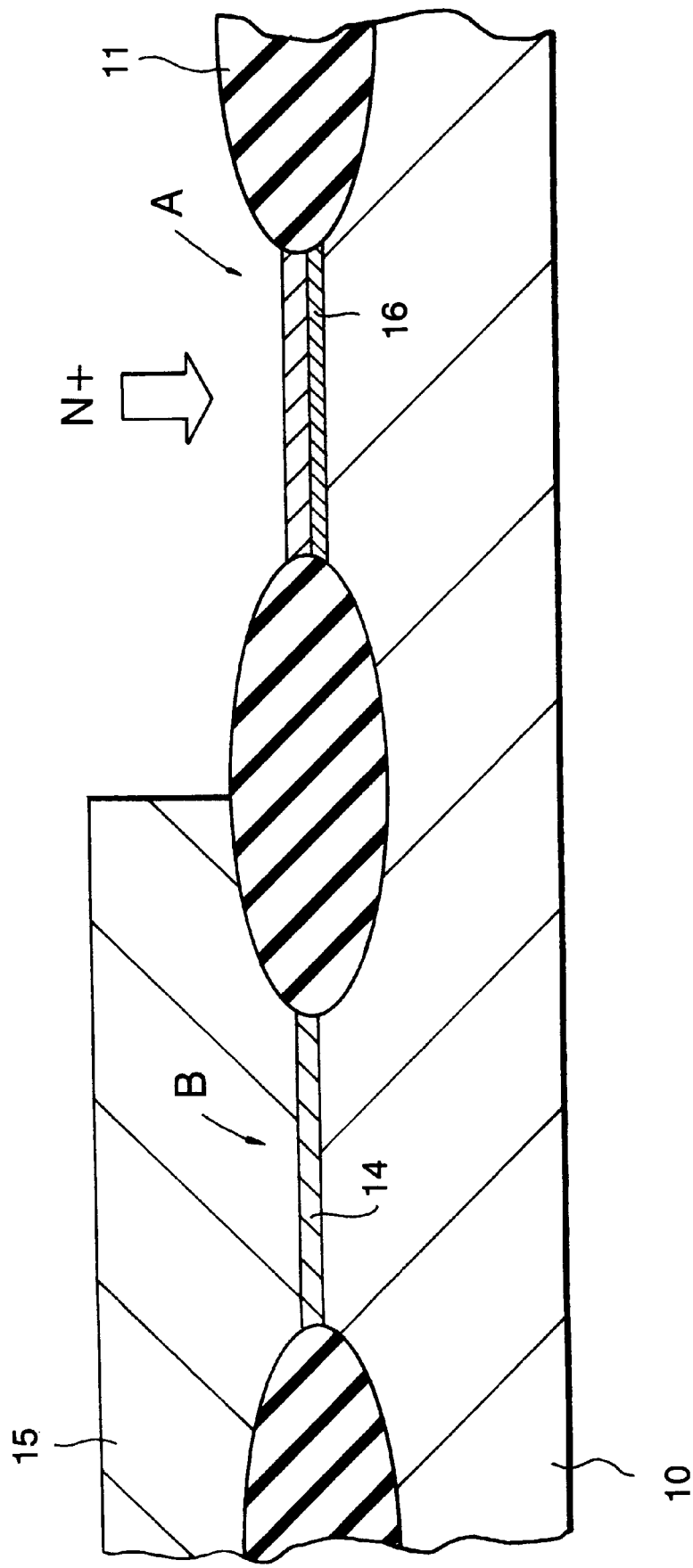

With reference to FIG. 7B, a photo-resist is applied onto a surface of the substrate for exposure and subsequent development to form a first photo-resist film 15 but only over the second device region "B". By use of the first photo-resist film 15 as a mask, a selective ion-implantation of nitrogen ions having a mass number of 14 is carried out at an acceleration energy of 10 KeV and at a dose of 5E14 atoms/cm$^2$, whereby the nitrogen ions are selectively implanted only into the first active region "A" thereby forming a nitrogen containing layer 16 under the silicon oxide film 14 on the first active region "A".

Figure 7C:
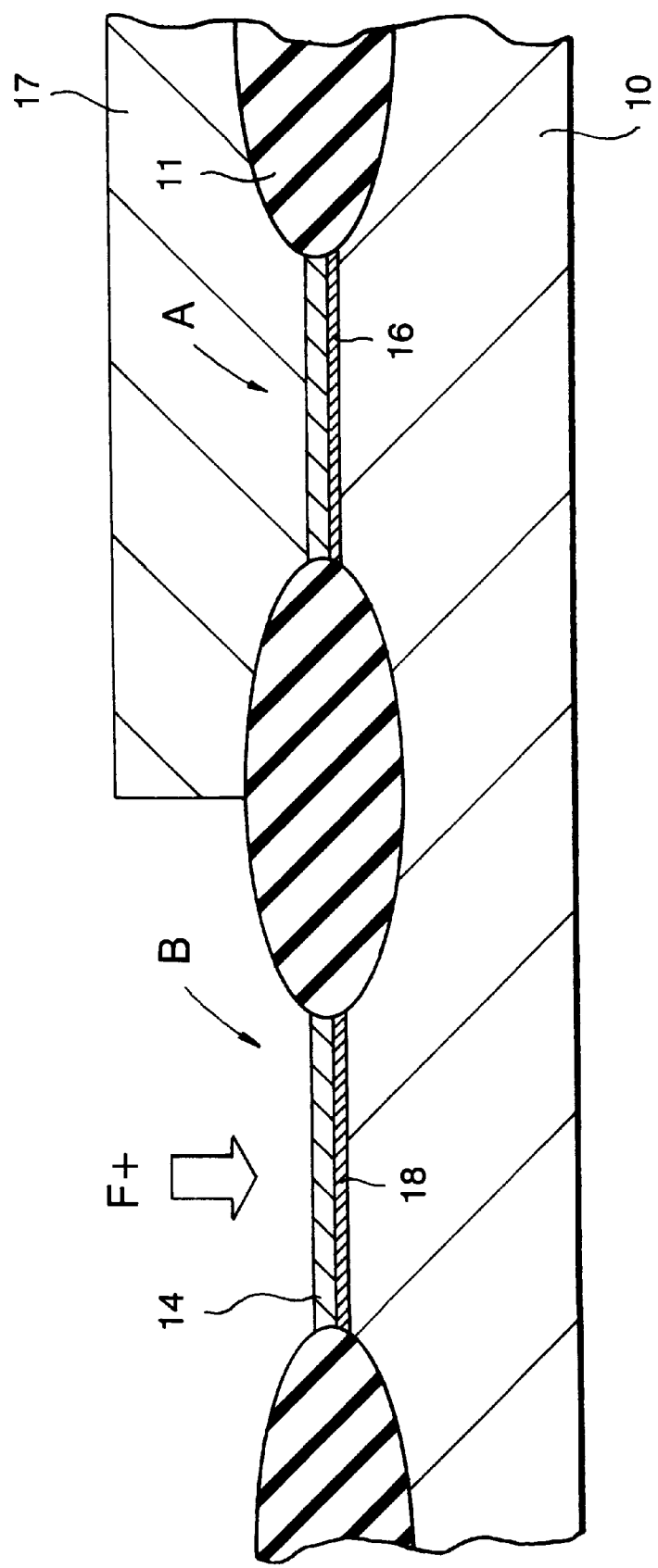

With reference to FIG. 7C, the above used first photo-resist film 15 is removed by an acidic peeling solution before a fresh photo-resist is applied on the surface of the substrate for exposure and subsequent development to form a second photo-resist film 17 but only on the first active region "A". By use of the second photo-resist film 17 as a mask, a selective ion-implantation of fluorine ions having a mass number of 19 is carried out at an acceleration energy of 10 KeV and at a dose of 2E14 atoms/cm$^2$, whereby the fluorine ions are selectively implanted only into the second active region "B" thereby forming a fluorine containing layer 18 under the silicon oxide film 14 on the second active region "B".

Figure 7D:
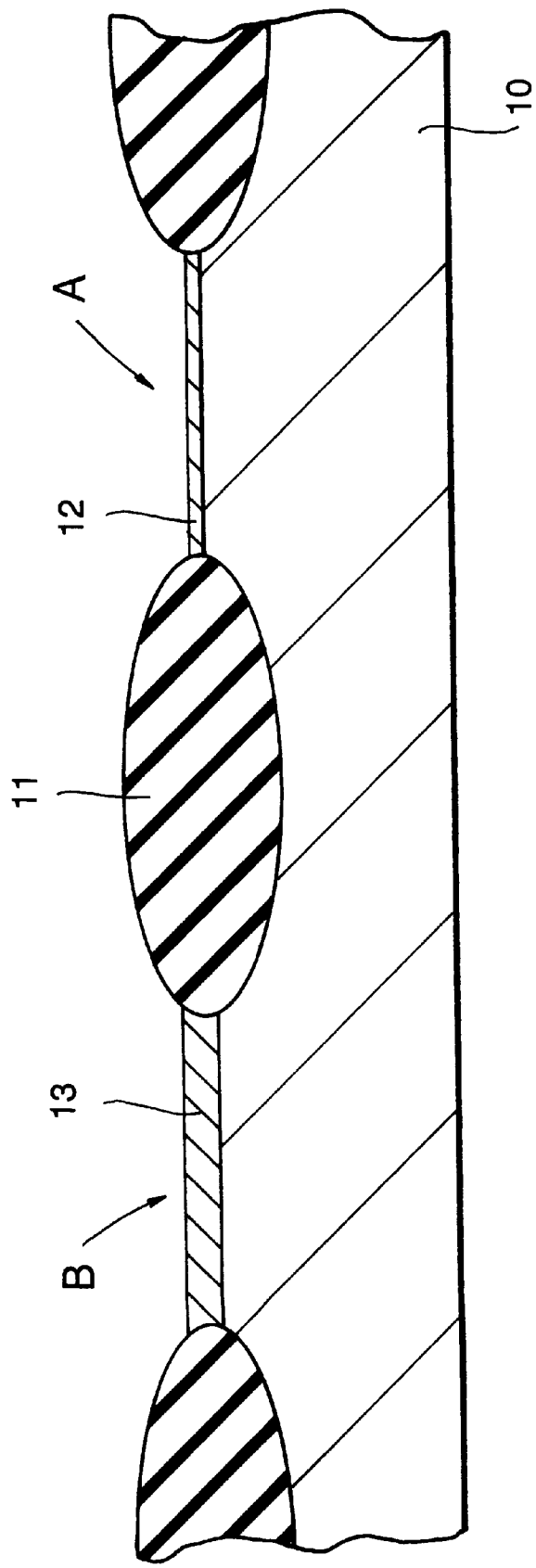

With reference to FIG. 7D, the above used second photo-resist film 18 is removed by an acidic peeling solution before the silicon oxide films 14 are further removed by a hydrofluoric acid based etchant. In addition, a surface of the silicon substrate is then cleaned, before a heat treatment is carried out in a steam atmosphere prepared by a pyrojenic method at a temperature of 850° C., whereby both the nitrogen containing layer 16 and the fluorine containing layer 18 are subjected to a thermal oxidation, wherein nitrogen contained in the nitrogen containing layer 16 suppresses the oxidation reaction to reduce the oxidation rate whereby a thin first gate oxide film 12 having a thickness of 3 nanometers is formed, whilst fluorine in the fluorine containing layer 18 promotes the oxidation reaction to increase the oxidation rate whereby a thick second gate oxide film 13 having a thickness of 8 nanometers is formed.

Figure 2:
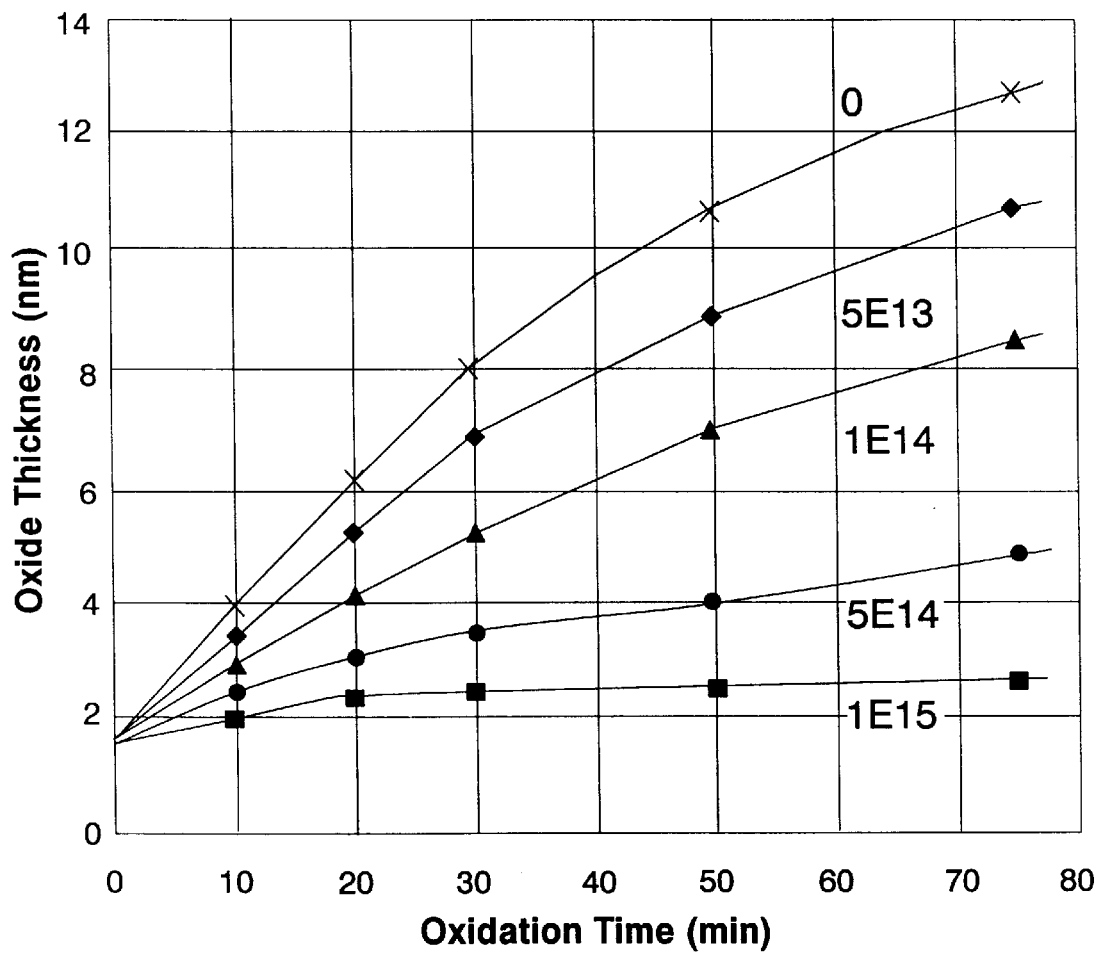
FIG. 2 is a diagram illustrative of variations in thickness of a gate oxide film over oxidation time under various conditions of dose of nitrogen ions into a silicon substrate, thereby illustrating a relationship of a growth rate of the gate oxide film to the nitrogen ion dose.

With reference again to FIG. 2, the dependency of the oxidation rate upon the dose of nitrogen under thermal oxidation conditions at a temperature of 850° C. and in a steam atmosphere as well as ion-implantation condition of 10 KeV as an acceleration energy will be described. As compared to the normal thermal oxidation free from any ion-implantation of nitrogen, the ion-implantation of nitrogen results in a remarkable reduction in oxidation rate of the thermal oxidation. As the dose of the nitrogen is increased, then the reduction in oxidation rate of the thermal oxidation is also made remarkable. If no nitrogen ion is introduced into the silicon substrate, then a thermal oxidation for 20 minutes results in a formation of an oxide film having a thickness of 6 nanometers. If nitrogen ions are introduced into the silicon substrate at a dose of 5E13, then a thermal oxidation for 20 minutes results in a formation of an oxide film having a thickness of 5.2 nanometers. If nitrogen ions are introduced into the silicon substrate at a dose of 1E14, then a thermal oxidation for 20 minutes results in a formation of an oxide film having a thickness of 4 nanometers. If nitrogen ions are introduced into the silicon substrate at a dose of 5E14, then a thermal oxidation for 20 minutes results in a formation of an oxide film having a thickness of 3 nanometers. If nitrogen ions are introduced into the silicon substrate at a dose of 1E15, then a thermal oxidation for 20 minutes results in a formation of an oxide film having a thickness of 2.4 nanometers The increase in dose of the nitrogen atoms into the silicon substrate reduces the oxidation rate of the oxide film.

Figure 3:
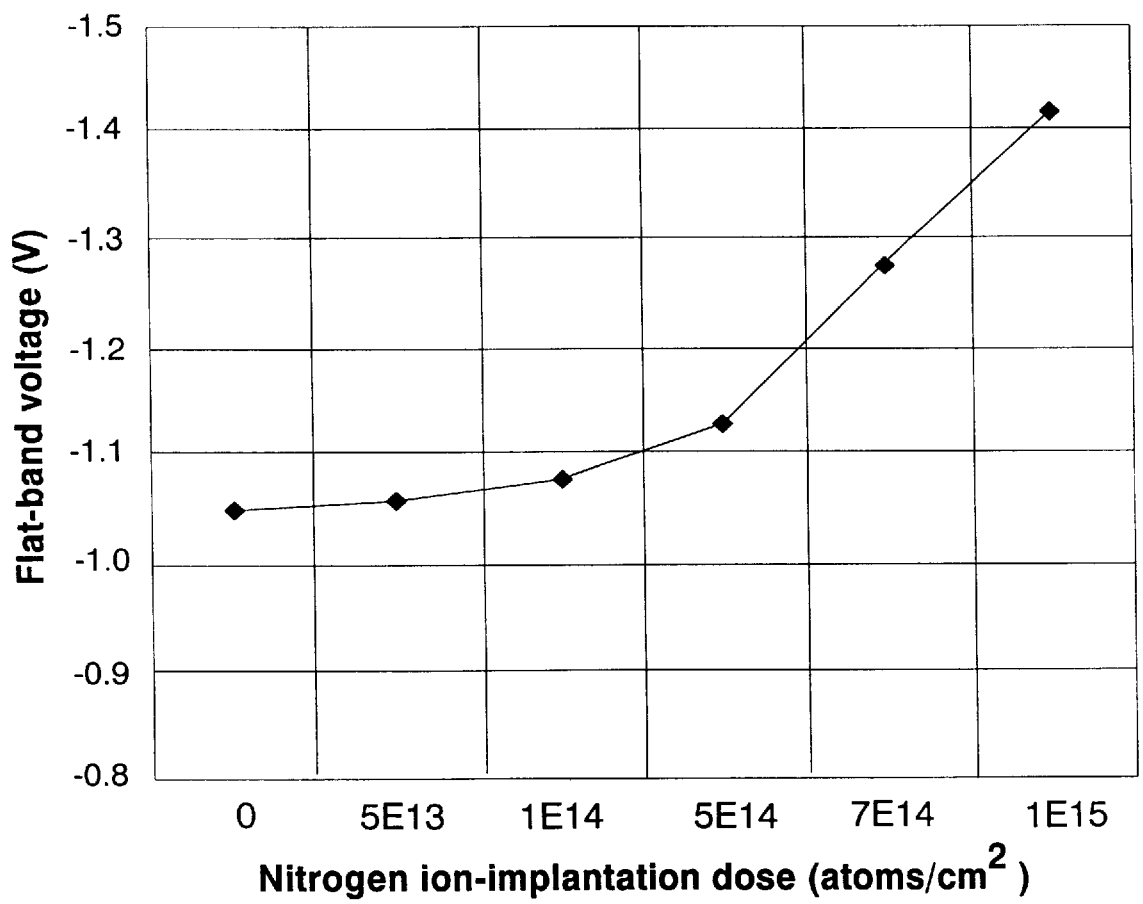
FIG. 3 is a diagram illustrative of variations in flat-band voltage of a field effect transistor having a gate oxide film formed on an nitrogen containing surface of a silicon substrate under various conditions of dose of nitrogen ions into the silicon substrate.

With reference again to FIG. 3, variations in flat-band voltage of a field effect transistor having a gate oxide film formed on an nitrogen containing surface of a silicon substrate under various conditions of dose of nitrogen ions into the silicon substrate will be described, wherein the MOS capacitor having the oxide film of 3 nanometers in thickness and the area of 0.001 cm$^2$. Increase of ion-implanted nitrogen atoms causes the increase of the fixed charges and also drop in electron mobility of the transistors, whereby the flat-band voltage is shifted. If the nitrogen ions are introduced into the silicon substrate at a dose of not less than 7E14 atoms/cm$^2$, the performance of the transistor having a thinner gate oxide film is dropped below the acceptable performance range, whereby the shift of the flat band voltage is made remarkable. Under the dose of 7E14 atoms/cm$^2$, the flat-band voltage is shifted by about 0.1V in the minus direction. A large shift of the flat-band voltage provides a bar to the device design. Notwithstanding, a shift of about 0.1V of the flat-band voltage is not so problem. Namely, it is unavailable to carry out the ion-implantation of nitrogen at a high dose of not less than 7E14 atoms/cm$^2$.

Figure 4:
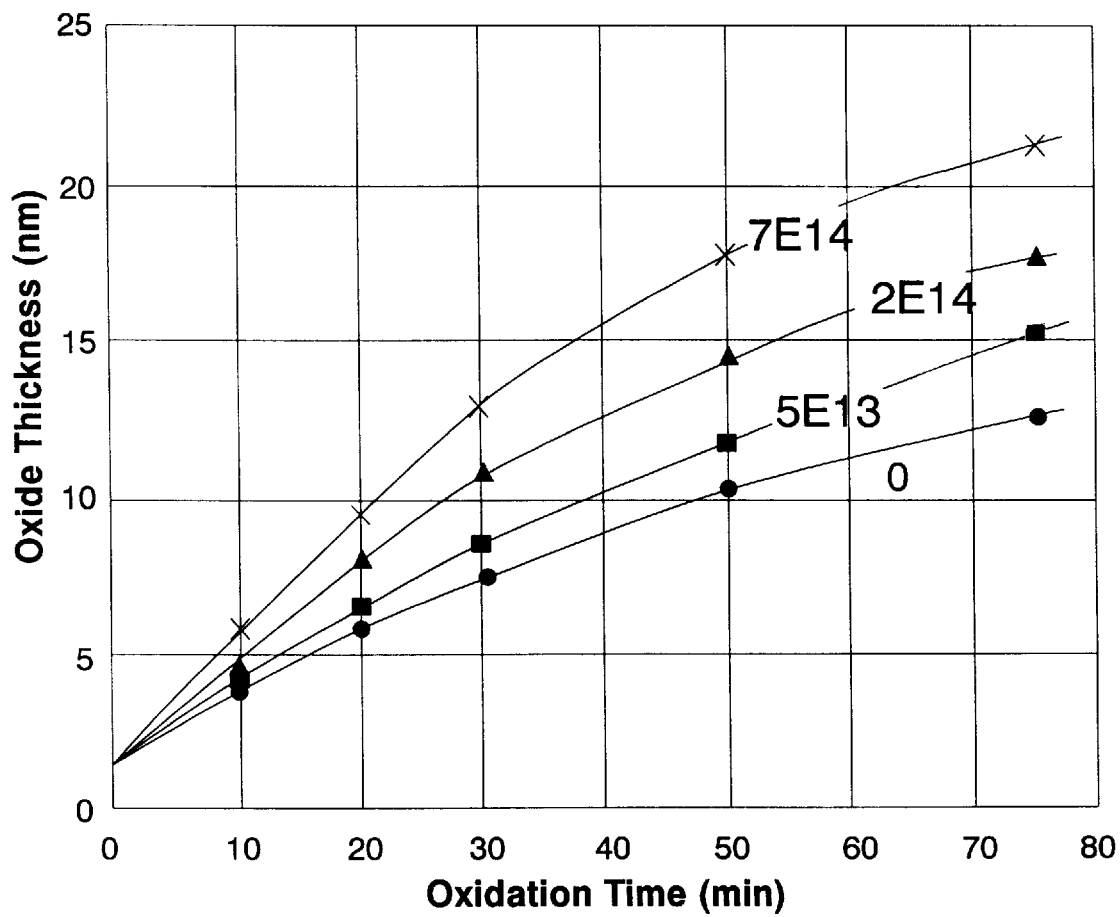
FIG. 4 is a diagram illustrative of variations in thickness of a gate oxide film over oxidation time under various conditions of dose of halogen atoms into a silicon substrate, thereby illustrating a relationship of a growth rate of the gate oxide film to the halogen atom dose.

With reference again to FIG. 4, variations in thickness of a gate oxide film over oxidation time under various conditions of dose of fluorine atoms into a silicon substrate will be described, in view of a relationship of a growth rate of the gate oxide film to the fluorine atom dose. If no fluorine atom is introduced into the silicon substrate, then a thermal oxidation for 20 minutes at a temperature of 850° C. results in a formation of an oxide film having a thickness of 6 nanometers. If fluorine atoms are introduced into the silicon substrate at a dose of 5E13, then a thermal oxidation for 20 minutes results in a formation of an oxide film having a thickness of 8 nanometers. If fluorine atoms are introduced into the silicon substrate at a dose of 2E14, then a thermal oxidation for 20 minutes results in a formation of an oxide film having a thickness of 8 nanometers. If fluorine atoms are introduced into the silicon substrate at a dose of 7E14, then a thermal oxidation for 20 minutes results in a formation of an oxide film having a thickness of 10 nanometers.

The increase in dose of the fluorine atoms into the silicon substrate increases the oxidation rate of the oxide film. This method doping the fluorine atoms into the silicon substrate is also engaged with the following problems.

Figure 5:
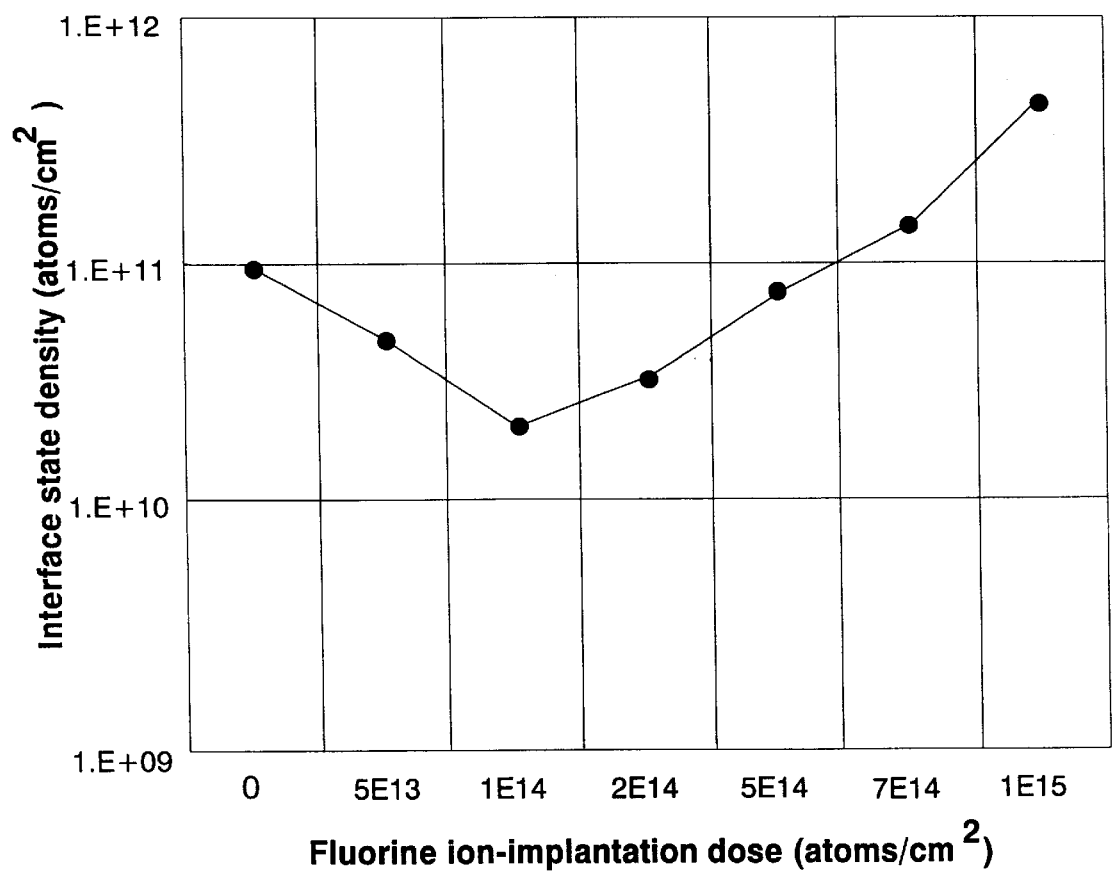
FIG. 5 is a diagram illustrative of variations in density of the interface state of the gate oxide film formed on a fluorine introduced silicon substrate surface by a thermal oxidation in a moisture atmosphere.

With reference again to FIG. 5, variations in density of the interface state of the gate oxide film formed on a fluorine introduced silicon substrate surface by a thermal oxidation in a moisture atmosphere will be described. The density of the interface state becomes minimum at the dose of fluorine atoms of about 1E14 atoms/cm$^2$. However, the increase in the dose of fluorine atoms from about 1E14 atoms/cm$^2$ also increases the density of the interface state, whereby the performances of the transistor are deteriorated. The dose of fluorine atoms of about 1E14 atoms/cm$^2$ relaxes the strain of the interface between silicon and silicon oxide. However, the higher dose than about 1E14 atoms/cm$^2$ results in no relaxation in the strain of the interface between silicon and silicon oxide. In order to realize a large difference in thickness of the gate oxide films, for example, 3 nanometers, it is necessary to introduce fluorine atoms at a dose of not less than 5E14 atoms/cm$^2$. The introduction of fluorine atoms at a dose of not less than 5E14 atoms/cm$^2$ results in a higher density of the interface state than the acceptable density range.

Consequently, the nitrogen containing thin first gate oxide film 12 has a thickness of 3 nanometers and a less amount of fixed charges as well as a superior characteristic. The fluorine containing thick second gate oxide film 13 has a thickness of 8 nanometers and a low density in interface state as well as a high reliability. The nitrogen containing thin first gate oxide film 12 and the fluorine containing thick second gate oxide film 13 are formed on the single silicon substrate by a single thermal oxidation process.

The thicknesses of the first and second gate oxide films and oxidation conditions may be variable. In place of nitrogen atoms having a mass number of 14, nitrogen molecules of a mass number of 28 or any molecules including nitrogen may be ion-implanted into the silicon substrate for subsequent thermal oxidation process. In place of fluorine, any molecules including fluorine or a halogen such as chlorine may be ion-implanted into the silicon substrate for subsequent thermal oxidation process.

In accordance with the above other present invention, it is possible to form at least two oxide films different in thickness from each other by a single thermal oxidation process. If those oxide films are applied to gate oxide films for field effect transistors, then it is possible to realize the field effect transistors showing different properties and characteristics. The thinner gate oxide film is free from deterioration in reliability of this gate oxide film and also free from variations in threshold voltage due to a phenomenon of punch through of boron from the gate electrode in a p-channel MOS field effect transistor. The thicker gate oxide film is free from formations of many interface states on an interface between silicon and silicon oxide as well as free from radiation damage.

Namely, processes are carried out for selectively introducing a first substance into the thin oxide film on the first region and a second substance into the thin oxide film on the second region respectively, wherein the first substance is capable of decreasing an oxidation rate of a thermal oxidation process whilst the second substance is capable of increasing an oxidation rate of a thermal oxidation process, and subsequently carrying out a thermal oxidation of the semiconductor substrate so as to form a first oxide film on the first region at a first oxidation rate and a second oxide film on the second region at a second oxidation rate higher than the first oxidation rate, whereby the first oxide film has a first thickness and the second oxide film has a second thickness which is thicker than the first thickness of the first oxide film, thereby allowing formations of the oxide films different in thickness by at least 3 nanometers from each other through a single thermal oxidation process without, however, any deteriorations of reliability and insulating properties. Both ion-implantations of the first and second substances to the thinner and thicker oxide films are essential for avoiding the problems caused by an excessively high dose of only one of the first and second substances. It is, therefore, possible to avoid the problems caused by the excessively high dose of the first substance, wherein the problems are concerned with the increase of the fixed charges and also drop in electron mobility of the transistors, deteriorating the high speed performances of the transistor as well as the deterioration in life-time of the oxide films. It is, further, possible to avoid the other problems caused by the excessively high dose of the second substance, wherein the problems are concerned with the increase in amount of the interface state, which deteriorates the reliability of the oxide films. Furthermore, as the requirement for scaling down the transistors has been on the increase, the requirement for reduction in thickness of the oxide films or gate oxide films has also bee on the increase. For the logic devices, the thickness of the gate oxide film is required to be not thicker than 3 nanometers. Under those requirement, it is difficult for the conventional or normal thermal oxidation process to form the oxide films having highly accurate or controlled thicknesses. In order to obtain a sufficient difference in thickness of the oxide films with keeping the required or desired characteristics and properties, it is required or essential to selectively introduce a first substance into the thin oxide film on the first region and a second substance into the thin oxide film on the second region respectively, wherein the first substance is capable of decreasing an oxidation rate of a thermal oxidation process whilst the second substance is capable of increasing an oxidation rate of a thermal oxidation process, and subsequently carry out a thermal oxidation of the semiconductor substrate so as to form a first oxide film on the first region at a first oxidation rate and a second oxide film on the second region at a second oxidation rate higher than the first oxidation rate, whereby the first oxide film has a first thickness and the second oxide film has a second thickness which is thicker than the first thickness of the first oxide film.

Whereas modifications of the present invention will be apparent to a person having ordinary skill in the art, to which the invention pertains, it is to be understood that embodiments as shown and described by way of illustrations are by no, means intended to be considered in a limiting sense. Accordingly, it is to be intended to cover by claims all modifications which fall within the spirit and scope of the present invention.

What is claimed is:

1. A structure comprising:
   a first oxide film having a first thickness and extending on a first region of a semiconductor substrate;
   a second oxide film having a second thickness which is thicker than said first thickness of said first oxide film, said second oxide film extending on a second region of said semiconductor substrate,
   wherein said first oxide film contains a first substance which is capable of decreasing an oxidation rate of a thermal oxidation process, whilst said second oxide film contains a second substance which is capable of increasing said oxidation rate of said thermal oxidation process.

2. The structure as claimed in claim 1, wherein said first substance includes nitrogen.

3. The structure as claimed in claim 1, wherein said second substance includes halogen.

4. The structure as claimed in claim 3, wherein said second substance includes fluorine.

5. A semiconductor device having a structure as claimed in claim 1.

6. A gate oxide structure comprising:

a semiconductor substrate having at least first and second surface regions isolated by a field oxide film;

a first gate oxide film having a first thickness and extending on said first surface region of said semiconductor substrate; and a second gate oxide film having a second thickness which is thicker than said first thickness of said first gate oxide film, said second gate oxide film extending on said second region of said semiconductor substrate, wherein said first gate oxide film contains a first substance which is capable of decreasing an oxidation rate of a thermal oxidation, whilst said second gate oxide film contains a second substance which is capable of increasing said oxidation rate of said thermal oxidation process.

7. The structure as claimed in claim 6, wherein said first substance includes nitrogen.

8. The structure as claimed in claim 6, wherein said second substance includes halogen.

9. The structure as claimed in claim 8, wherein said second substance includes fluorine.

10. A semiconductor device having a structure as claimed in claim 6.

* * * * *